United States Patent [19]
Arcus et al.

[11] Patent Number: 5,523,723
[45] Date of Patent: Jun. 4, 1996

[54] LOW NOISE LOW VOLTAGE PHASE LOCK LOOP

[75] Inventors: Christopher G. Arcus, San Jose; Bharat Bhushan, Cupertino; Paul D. Ta, San Jose, all of Calif.

[73] Assignee: VLSI Technology, Inc., San Jose, Calif.

[21] Appl. No.: 443,131

[22] Filed: May 17, 1995

[51] Int. Cl.$^6$ .............................. H03B 5/04; H03L 7/099
[52] U.S. Cl. ................................ 331/17; 331/25; 331/34; 331/57
[58] Field of Search ................................. 331/17, 25, 34, 331/57

[56] References Cited

U.S. PATENT DOCUMENTS 5,285,173   2/1994   Reynolds .................................. 331/57

*Primary Examiner*—Siegfried H. Grimm
*Attorney, Agent, or Firm*—Patrick T. King

[57] ABSTRACT

A ring-style, multi-stage VCO of a phase lock loop circuit includes two or more differential amplifier stages. The phase lock loop includes a lowpass filter connected between a control voltage terminal and a voltage-to-current converter stage, which includes a first source-follower MOS transistor M1 with a source resistor R1 and a diode-connected MOS transistor M2 connected to its drain terminal. A current-source MOS transistor M8 has a gate terminal connected to the drain of the first MOS transistor M1 such that the transistor M8 mirrors current of transistor M1. A diode-connected transistor M9 has its gate terminal and its drain terminal connected together and also to the drain terminal of transistor M8. A differential amplifier stage includes a current-source MOS transistor M10 having a gate terminal connected to the drain of the first MOS transistor M1 to current mirror the drain current of M1. The differential amplifier stage also includes a pair of MOS transistors M4 and M5 connected to the drain terminal of the current-source MOS transistor M10. The gate terminal of MOS transistor M4 is an IN terminal and the gate terminal of MOS transistor M5 is an IN_ terminal. The drain terminal of MOS transistor M4 provides an OUT_ signal for the differential amplifier stage and the drain terminal of MOS transistor M5 provides an OUT signal for the differential amplifier stage. A MOS transistor M6 forms a load impedance for MOS transistor M4 and a MOS transistor M7 forms a load impedance for MOS transistor M5. The gate terminals of M6 and M7 are connected to the drain terminal of transistor M9.

4 Claims, 3 Drawing Sheets

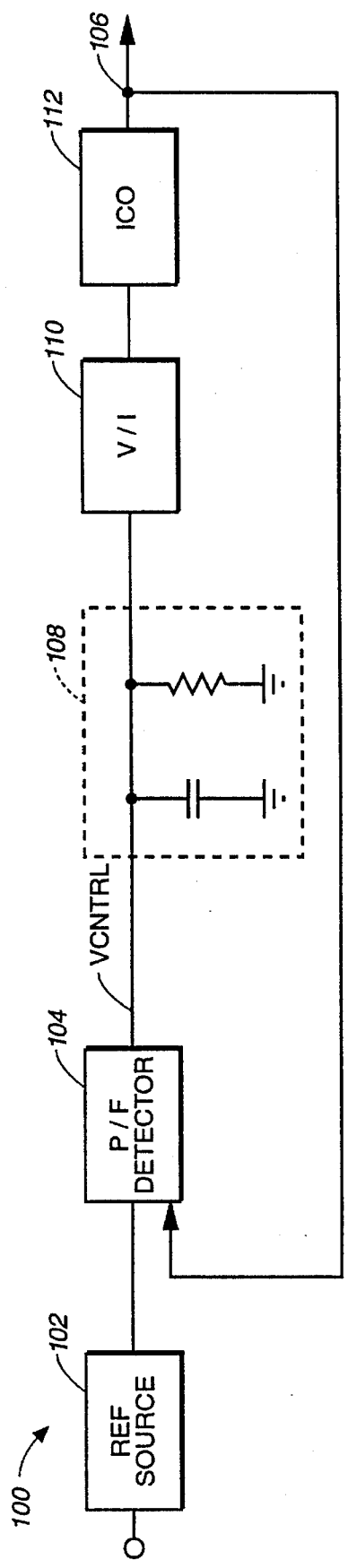
FIG._1
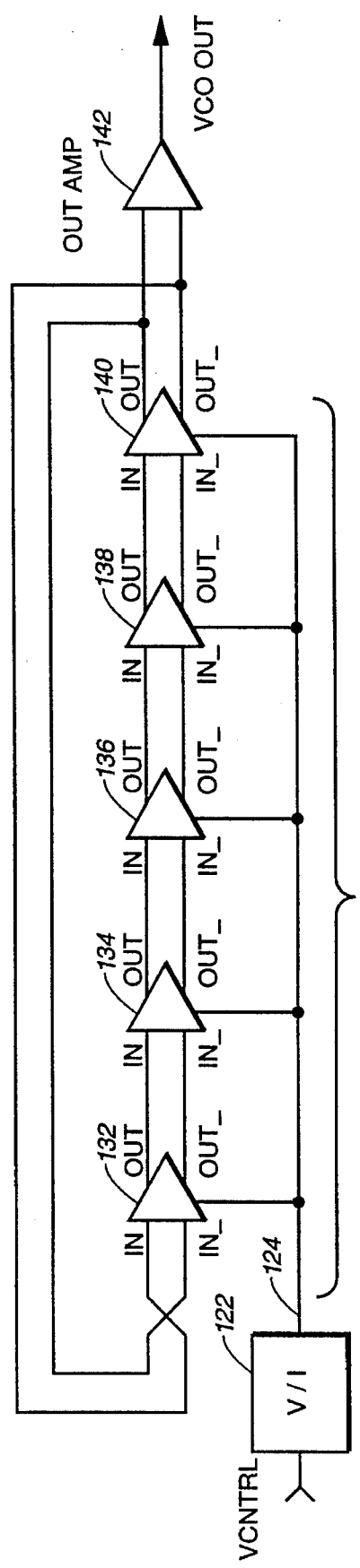
FIG._2

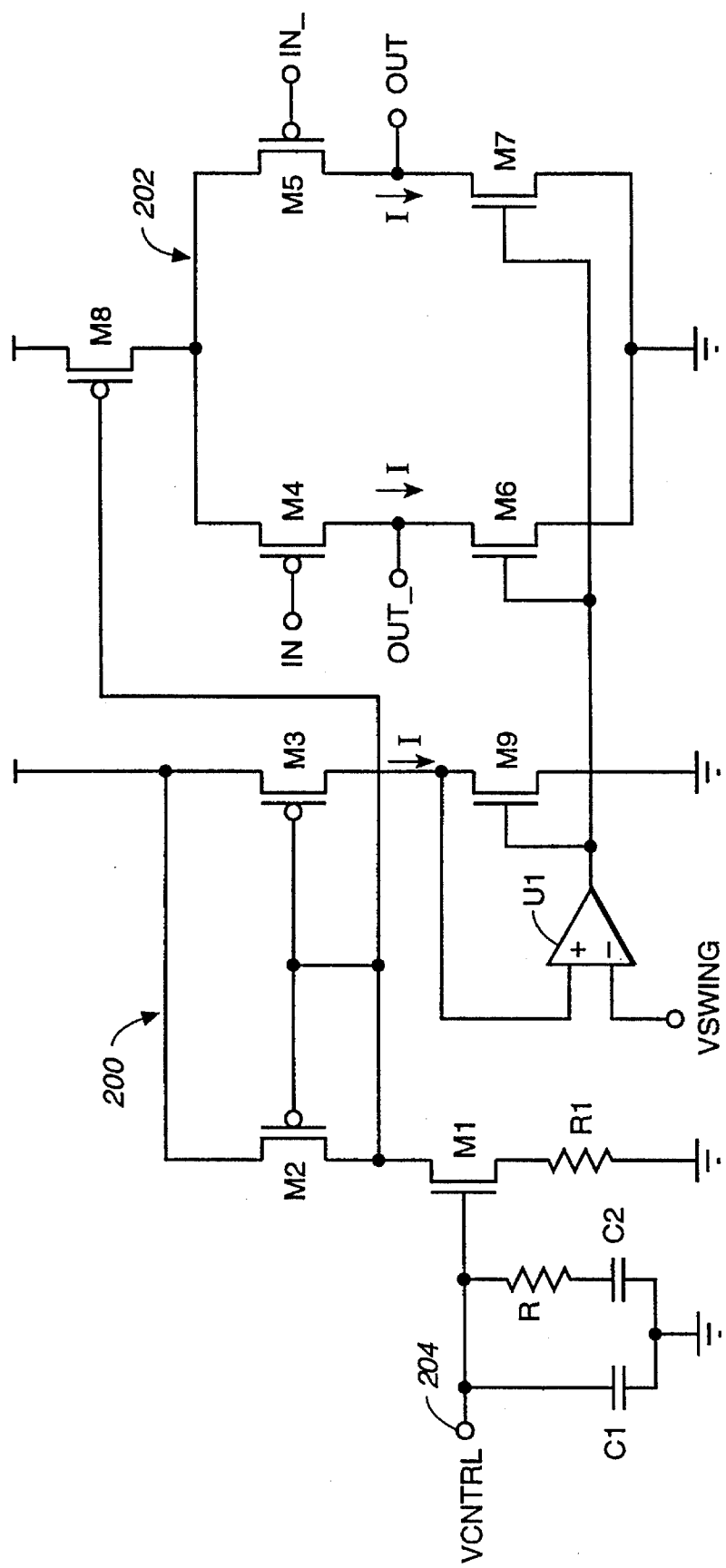
*FIG._3*
*(PRIOR ART)*

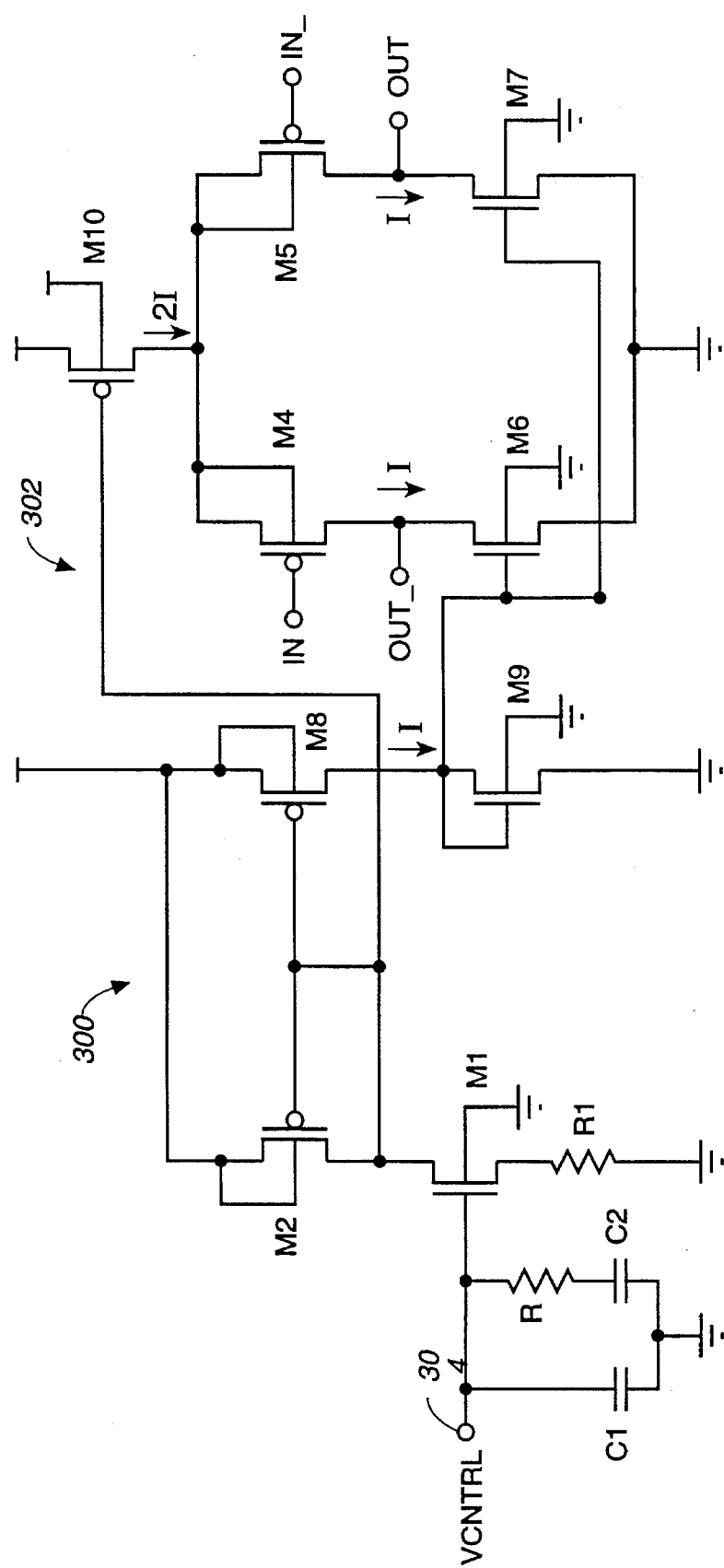
FIG._4

5,523,723

LOW NOISE LOW VOLTAGE PHASE LOCK LOOP

TECHNICAL FIELD

The present invention relates generally to controlled oscillators and, more particularly, to voltage controlled oscillators for use in phase locked loops.

BACKGROUND OF THE INVENTION

Prior art VCO circuits use a replica bias circuit to limit the voltage swing in current-controlled differential amplifier stages of the VCO. The frequency of a current-controlled VCO is directly proportional to the current through the differential amplifier stages of the VCO. The frequency of a current-controlled VCO is inversely proportional to the circuit capacitance and to the voltage swing in the differential amplifier stages. In order to provide a linear frequency-versus current characteristic, it is desirable to keep the voltage swing a constant. A replica bias circuit is used to control the voltage swing of the differential amplifier stages of the VCO. The replica bias circuit is a feedback loop circuit which uses a high gain operational amplifier and a reference MOS transistor with the same characteristics as the load transistors of the differential amplifier stages of the VCO. The replica bias circuit is configured so that the gate voltages, the drain voltages, and the currents of the reference MOS transistor and the load transistors of the differential amplifier stages are the same. An external bias voltage applied to one input terminal of the operational amplifier controls the output amplitude swings of the differential amplifier stages of the VCO.

The voltages at the gates of the load transistors of the differential amplifier stages are not bypassed at high frequencies. The load transistors of the differential amplifier stages are subject to all of the noise signals caused by the active circuitry of the feedback loop formed by the high gain operational amplifier and the reference MOS transistor.

Also the feedback loop of the replica bias circuit is difficult to stabilize over a wide range of VCO control voltage inputs, which produce a wide range of control currents. The currents through the VCO differential amplifier stages are changed to control the delays through each stage. The changes in delays vary the frequency of oscillation of the VCO.

It may be shown that if the operational amplifier of the replica biasing feedback loops is a 2 stage internally compensated amplifier, the replica bias feedback loop will become unstable at low drain currents through the reference MOS transistor when the gate voltage of the reference MOS transistor is low and the reference MOS transistor is in a high gain saturation region with extra gain and phase shift which causes the feedback control loop to become unstable. When the loop control voltage is low, the VCO frequency is low and instability occurs. Low frequency jitter increases until the phase lock loop loses lock. This makes a targeted VCO frequency range much more difficult to obtain over variations in process parameters, temperature, and supply voltages. For lower supply voltages, these problems are worse because the stable linear region range for the gate voltages of the load transistors of the differential amplifier stages is smaller. For example, with the feedback loop replica biasing scheme as described above, the load transistors of the differential amplifier stages are in their linear regions with gate-to-source voltages greater than 2 volts.

Thus, a need exists for low noise, low voltage, stable amplifier stages for the VCO of a phase lock loop.

SUMMARY OF THE INVENTION

It is, therefore, an object of the present invention to provide a stable phase lock loop which operates at low voltages and which has very low noise.

In accordance with this and other objects of the invention, an amplifier stage for a ring-style, multi-stage VCO of a phase lock loop circuit is provided which includes an input terminal for receiving a control voltage. A lowpass filter is connected between the input terminal and a first reference voltage. A voltage to current converter stage includes a first MOS transistor M1 of a first type having a gate terminal connected to the input terminal, having a source terminal connected through a resistor R1 to the first reference voltage, and having a drain terminal. A second diode-connected MOS transistor M2 of a second type has a drain terminal and a gate terminal connected together and has a source terminal connected to a second reference voltage. A current-source MOS transistor M8 of the second type has a source terminal connected to the second reference voltage, has a gate terminal connected to the drain of the first MOS transistor M1, and has a drain terminal so that the transistor M8 mirrors current of transistor M2. A diode-connected transistor M9 of the first type has a gate terminals and a drain terminal connected together and to the drain terminals of transistor M8.

A differential amplifier stage includes a current-source MOS transistor M10 of the second type having a source terminal connected to the second reference voltage, having a gate terminal connected to the drain of the first MOS transistor M1, and having a drain terminal. A pair of MOS transistors M4 and M5 of the first type have their source terminals connected together and to the drain terminal of the current-source MOS transistor M10. A gate terminal of MOS transistor M4 is designated as an IN terminal and a gate terminal of MOS transistor M5 is designated as an IN_ terminal. A drain terminal of MOS transistor M4 provides an OUT_ signal for the differential amplifier stage and a drain terminal of MOS transistor M5 provides an OUT signal for the differential amplifier stage.

A MOS transistor M6 of the first type forms a load impedance for MOS transistor M4. A drain terminal of MOS transistor M6 is connected to a drain terminal of MOS transistor M4. A source terminal of MOS transistor M6 is connected to the first reference voltage. A gate terminal of MOS transistor M6 is connected to the gate and source terminals of the diode-connected transistor M9.

A MOS transistor M7 of the first type forms a load impedance for MOS transistor M5. A drain terminal of MOS transistor M7 is connected to a drain terminal of MOS transistor M5. A source terminal of MOS transistor M7 is connected to the first reference voltage. A gate terminal of MOS transistor M6 is connected to the gate and source terminals of the diode-connected transistor M9. The diode-connected transistor M9 provides a low impedance to ground for the gate terminals of M6 and M7.

The first type of MOS transistor is an NMOS type and the second type of MOS transistor is a PMOS type.

A phase lock loop circuit according to the invention includes a reference signal input terminal and a phase/frequency detector circuit. The phase/frequency detector has a first input terminal connected to the reference signal input terminal, a second input terminal, and an output terminal for providing a control voltage.

A lowpass filter circuit is connected to the output terminal of the phase detector circuit. A voltage-to-current converter stage has an input terminal connected to the lowpass filter circuit has an output terminal providing an output current proportional to the control voltage. A current-source MOS transistor M8 of the second type has a source terminal connected to the second reference voltage, has a gate terminal connected to the drain of the first MOS transistor M1, and has a drain terminal so that the transistor M8 mirrors current of transistor M2. A diode-connected transistor M9 of the first type has a gate terminal and a drain terminal connected together and to the drain terminals of transistor M8. The diode-connected transistor M9 provides a low impedance to ground for the gate terminals of M6 and M7.

A VCO for the phase lock loop includes two or more differential amplifier stages. Each stage includes a current-source MOS transistor M10, a pair of MOS transistors M4 and M5 of the first type, a MOS transistor M6 of the first type which forms a load impedance for MOS transistor M4, a MOS transistor M7 of the first type which forms a load impedance for MOS transistor M5. The IN terminals and the IN_ terminals of each stage are connected to OUT and OUT_ terminals of another stage to provide the VCO for the phase lock loop.

The invention eliminates the replica biasing feedback loop which sets the bias for transistors M6 and M7. The gates of these transistors are driven from a low-impedance point. This arrangement avoids the instabilities and noise of the prior art circuit so that there is no M6,7 gate feedback loop or instability. The VCO is guaranteed to start, because if the channel width to length ratios W/L are equal and a current I flows through M7,6, and 9 and a current 2I flows through M3, then M6 and M7 are in a high output impedance saturation region at the VCO amp equilibrium quiescent state. The VCO amp thus has high small signal gain and will always start. Also VCO will work at low VCNTRL voltage inputs because no instabilities exist as in the prior art circuit. This stable condition is maintained regardless of VCNTRL and across the wide range of VCNTRL inputs.

Performance over a frequency range of 300 kHz to 300 MHz is achieved while the prior art does not work at frequencies less than 30 MHz.

Applications of the invention are for low-noise clock deskewing on low voltage integrated circuits over a wide range of frequencies, clocking of pixels on a display screen for finer resolution, and data recovery for disk drives, telecommunications, SONET, FDDI, and serial storage architecture SSA.

BRIEF DESCRIPTION OF THE DRAWINGS

The accompanying drawings which are incorporated in and form a part of this specification, illustrate embodiments of the invention and, together with the description, serve to explain the principles of the invention:

FIG. 1 is a circuit diagram of a phase lock loop.

FIG. 2 is a circuit diagram of a conventional multi-stage current-controlled oscillator.

FIG. 3 is a circuit diagram of a single stage of the multi-stage current-controlled oscillator of FIG. 2.

FIG. 4 is a circuit diagram of a single stage of a multi-stage current-controlled oscillator according to the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIG. 1 shows a phase lock loop circuit 100. A reference signal is provided by a reference signal source 102 to one input terminal of a phase/frequency detector 104. Another input terminal of the phase/frequency detector 104 is provided with a synthesized signal from an output terminal 106 of the phase lock loop circuit 100. The phase/frequency detector 104 compares the two input signals and provides an output signal proportional to the difference in phase/frequency between the two input signals. The output signal from the phase/frequency detector 104 is filtered by a lowpass filter circuit 108 to provide a control voltage which is then applied to an input terminal of a voltage-to-current (V/I) converter circuit 110. The output signal of the voltage-to-current converter 110 is applied to an input terminal of a current-controlled oscillator 112. The output signal of the current-controlled oscillator 112 is available at the output terminal 106 of the phase lock loop circuit 100.

FIG. 2 shows a multi-stage current-controlled oscillator 120, which performs the function of the voltage-to-current (V/I) converter circuit 110 and the current-controlled oscillator 112 of FIG. 1. A control voltage from a low pass filter circuit is applied to the input terminal of a V/I converter circuit 122. A current control signal is provided on signal line 124.

A ring current-controlled oscillator (ICO) is formed by feeding the output signal of an amplifier string, which has a phase shift of n times 180 degrees, through a delay circuit to the input terminal of the amplifier string. An example of a ring current-controlled oscillator 130 is formed by a number of cascaded differential input and differential output amplifiers 132, 134, 136, 138, 140, connected in cascade as shown. The differential output signals of the last stage 140 of the ring current-controlled oscillator 130 are fed to the differential input terminals of the first stage 132, as shown in the Figure. The differential output signals of the last stage 140 are fed to differential input terminals of a single-ended output amplifier 142, which provides an output signal.

FIG. 3 shows a voltage-to-current converter 200 and a single stage of a multi-stage current-controlled oscillator 200, such as described in connection with FIG. 2. A control voltage VCNTRL signal is applied to an input terminal 204. A low-pass filter is provided by capacitors C1, C2 and resistor R. The filtered control signal is applied to the gate terminal of a source-follower NMOS transistor M1 which has its source terminal connected through a resistor R1 to a ground reference voltage potential. The amount of current flowing through R1 is controlled by the VCNTRL signal.

The drain terminal of the NMOS transistor M1 is connected to the drain terminal of a diode-connected PMOS transistor M2, which has its gate terminal and drain terminal connected together. The substrate and source terminal of M2 are connected to a positive voltage reference terminal. The current through M2 is controlled by the control voltage VCNTRL.

The gate and source terminals of M2 are connected to the gate terminal of a PMOS transistor M3. The source terminal of M3 is connected to the positive voltage reference terminal. M2 and M3 form a current mirror circuit such that the drain current I of M3 is proportional to the drain current of M1.

A differential amplifier stage is formed of two PMOS transistors M4 and M5, which have their substrates and source terminals connected together. A NMOS transistor M6 forms a load impedance for M4 and a NMOS transistor M7 forms a load impedance for M5. The drain terminal of M6 is connected to the drain terminal of M4 and the source terminal of M6 is connected to the ground reference voltage potential. The drain terminal of M7 is connected to the drain terminal of M5 and the source terminal of M7 is connected to the ground reference voltage potential. The source terminals of M4 and M5 are connected to the drain terminal of a PMOS transistor M8, which has its source terminal connected to the positive voltage reference terminal. The gate terminal of M8 is connected to the drain terminal of M2.

The gate terminal of M4 is designated as the IN terminal. The gate terminal of M5 is designated as the IN_ terminal. The drain terminal of M4 provides an OUT_ signal and the drain terminal of M5 provides an OUT signal for the ICO 202.

A prior art replica biasing feedback loop is provided with a NMOS transistor M9 and an amplifier U1. The drain terminal of M9 is connected to the drain terminal of M3 and to the positive input terminal of U1. The source terminal of M9 is connected to the ground reference voltage potential. The negative input terminal of U1 is connected to a bias control voltage VSWING, which has a value, for example, of 0.8 volts. The output terminal of U1 is connected to the gate of M9. The output terminal of U1 is also connected to the gate terminals of M6 and M7.

U1 and M9 are used in the feedback loop as a replica biasing circuit to control the signal amplitude of the differential amplifier stage formed be M4, M5, M6 and M7. M9 is a duplicate of M6 and M7. The high gain amplifier U1 causes the drain voltage of M9 to be close to the VSWING voltage. Because the source terminals of M9, M6, and M7 are all grounded and because the gate terminals are all tied together, the drain terminals of M9, M6, and M7 all have the same voltages close to VSWING. Note that the voltage at the gates of load transistors M6 and M7 is not bypassed at high frequencies and is subject to all of the noise caused by the active circuitry of U1 and noise on the VSWING voltage. Therefore, it is more susceptible to noise.

Also the control loop formed by U1 and M9 is difficult to stabilize over a wide range of VCNTRL input signals. A wide range of VCNTRL input signals produces a wide range of M3 drain currents I. In particular, it can be shown that if U1 is a 2-stage internally compensated amplifier, the U1 and M9 loop will become unstable at low M3 drain currents when the M9 gate voltage is low. Under these conditions, M9 is in a high-gain saturation region so that the gain of the common source amplifier M9 is high. This produces a third U1, M9 control loop gain stage with extra gain and phase shift which causes the U1, M9 control loop to become unstable.

When VCNTRL is low in voltage, the ICO frequency is low and instability occurs. Low frequency jitter increases until the phase lock loop loses lock. This makes a desired VCO frequency much more difficult to attain over variations in process, temperature, and supply voltage. For lower supply voltages the problem gets much worse because the range of M6 and M7 gate voltages where M6 and M7 are in a stable linear region is small. M6 and M7 are in the linear region only with their VGS voltages between 2 V to 3 V. Consequently, a phase lock loop using this approach has a limited frequency range as well as being noisy.

FIG. 4 shows a voltage-to-current converter 300 and a single stage of multi-stage current-controlled oscillator ICO 302 according to the invention. The multi-stage current-controlled oscillator ICO 302 is similar to that described in connection with FIG. 2. A control voltage VCNTRL signal is applied to an input terminal 304. A low-pass filter is provided by capacitors C1, C2 and resistor R. The filtered control signal is applied to the gate terminal of the source-follower NMOS transistor M1 which has its source terminal connected through the resistor R1 to the ground reference voltage potential. The amount of current flowing through R1 is controlled by the VCNTRL signal at the gate terminal of M1.

The drain terminal of the NMOS transistor M1 is connected to the drain terminal of a diode-connected PMOS transistor M2, which has its gate terminal and drain terminal connected together. The substrate and source terminal of M2 are connected to the positive voltage reference terminal. The current through M2 is controlled by the control voltage VCNTRL at the gate terminal of M1.

The gate and source terminals of M2 are also connected to the gate terminal of a PMOS current-mirror transistor M8. The source terminal of M8 is connected to the positive voltage reference terminal. The drain terminal of M8 is connected to the drain and gate terminals of a diode-connected NMOS transistor M9. The drain terminal of M9 is connected to the ground reference potential. The drain current of M8 is proportional to the drain current of M1.

The gate and source terminals of M2 are also connected to the gate terminal of a PMOS transistor M10. The source terminal of M10 is connected to the positive voltage reference terminal. The drain terminal of M10 is connected to the source terminals of M4 and M5. M2 and M10 also form a current mirror circuit such that the drain current of M10 is also proportional to the drain current of M1.

A differential amplifier stage is formed of the two PMOS transistors M4 and M5, which have their substrates and source terminals connected together and to the drain terminal of M10. The NMOS transistor M6 forms the load impedance for M4 and the NMOS transistor M7 forms the load impedance for M5. The drain terminal of M6 is connected to the drain terminal of M4 and the source terminal of M6 is connected to the ground reference voltage potential. The drain terminal of M7 is connected to the drain terminal of M5 and the source terminal of M7 is connected to the ground reference voltage potential. The source terminals of M4 and M5 are connected to the drain terminal of the PMOS transistor M10, which has its source terminal connected to the positive voltage reference terminal. The gate terminal of M4 is designated as the IN terminal. The gate terminal of M5 is designated as the IN_ terminal. The drain terminal of M4 provides an OUT_ signal and the drain terminal of M5 provides an OUT signal for the ICO 302.

The gates of transistors M6 and M7 are connected to the gate and source terminals of M9. This arrangement avoids the instabilities and noise of the prior art circuit of FIG. 3. In this case there is no M6,7 gate feedback loop or instability. The channel width/length W/L ratios of M9, M6, M7 are set to be equal and a current I flows through M7,6, and 9 and a current 2I flows through M10. Then M6, and M7 are in their high output impedance saturation regions for the VCO equilibrium quiescent state of the amplifier stages so that the VCO is guaranteed to start. The VCO amplifier has high small signal gain and always starts because gain is always greater than one. The VCO also works at low VCNTRL voltage inputs because no instabilities exist as in the prior art circuit. This condition is maintained regardless of VCNTRL and across the wide range of VCNTRL inputs.

M9 provides the gate voltages of M6 and M7. The gate voltages at M6 and M7 are analogs of VCNTRL at terminal 304. The current through M1 is proportional to VCNTRL. M8 mirrors the current through M1 and provides the current for M9.

Signals at the input terminal 304 are also filtered by the lowpass filter formed by capacitors C1, C2 and resistor R. M9 also provides a low impedance to ground. This removes noise from the gates of M6 and M7. In contrast to the prior art circuit of FIG. 3, M6 and M7 are not driven by an unstable loop so that there is no feedback loop instability. AVCO using such an arrangement works with low VCNTRL voltage inputs signals because no instabilities exist caused by an unstable loop at the input.

Optional voltage clamp circuits, such as, for example, diode-connected MOSFET transistors connected to ground, may also be provided at the drain terminals of M6 and M7 to further limit the voltage swings of the OUT and OUT_ signals, if desired.

This circuit of FIG. 4 has been built in a silicon integrated-circuit form. The circuit was tested and found to operate in the frequency range of 300 kHz to 300 MHz, which was limited only by the loop filter characteristics. The prior art circuit of FIG. 3 did not operate at frequencies lower than 30 MHz. Rms edge jitter performance is improved by at least a factor of three using the present invention. Rms edge jitter was measured for the present invention at 40 Mhz to typically be 10 picoseconds, while the prior art circuit using an active feedback loop for replica biasing was found to be 35 to 50 picoseconds. Below 30 Mhz the prior art circuit lost lock, while the present invention maintained lock down to 300 kHz.

In summary, the present invention of FIG. 4 eliminates the prior art feedback loop which is used for setting the bias for transistors M6 and M7. The gates of transistors M6 and M7 are driven from a low impedance point with an analog of the control signal from the filtered input node 304. The present invention avoids noise and instability produced by a feedback loop on the gates of the transistors M6 and M7. With the W/L ratios of the M9 and M6, M7 properly set, then the amplifier gain is always greater than one in equilibrium, which ensures that the VCO always starts. A VCO provided by using the amplifier stages according to the invention operates with low VCNTRL voltage input signals because no circuit instabilities exist.

Applications of the invention are for low-noise clock deskewing on low voltage integrated circuits over a wide range of frequencies, clocking of pixels on a display screen for finer resolution, and data recovery for disk drives, telecommunications, SONET, FDDI, and serial storage architecture SSA.

There are a number of advantage provided by limiting the voltage swing of a current-controlled oscillator according to the invention. The voltage swing is limited at high frequencies to provide sufficient headroom, or range of operation for a wide frequency range oscillator. Low voltage operation is improved. Noise is reduced. A more linear frequency versus control voltage characteristic is obtained. Less sensitivity to process variables produces higher production yields.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. An amplifier stage for a ring-style, multi-stage VCO of a phase lock loop circuit, comprising:

an input terminal for receiving a control voltage;

a lowpass filter connected between the input terminal and a first reference voltage;

a voltage to current converter stage including:

a first MOS transistor M1 of a first type having a gate terminal connected to the input terminal, having a source terminal connected through a resistor R1 to the first reference voltage, and having a drain terminal;

a diode-connected MOS transistor M2 of a second type having a drain terminal and a gate terminal connected together and to the drain terminal of the first MOS transistor M1, and having a source terminal connected to a second reference voltage;

a current-source MOS transistor M8 of the second type having a source terminal connected to the second reference voltage, having a gate terminal connected to the drain of the first MOS transistor M1, and having a drain terminal wherein the transistor M8 mirrors current of transistor M1;

a diode-connected transistor M9 of the first type having a gate terminal and a drain terminal connected together and to the drain terminal of transistor M8, and a source terminal connected to the first reference voltage;

a differential amplifier stage including:

a current-source MOS transistor M10 of the second type having a source terminal connected to the second reference voltage, having a gate terminal connected to the drain of the first MOS transistor M1, and having a drain terminal;

a pair of MOS transistors M4 and M5 of the first type having source terminals connected together and to the drain terminal of the current-source MOS transistor M10, wherein a gate terminal of MOS transistor M4 is designated as an IN terminal, wherein a gate terminal of MOS transistor M5 is designated as an IN_ terminal, wherein a drain terminal of MOS transistor M4 provides an OUT_ signal for the differential amplifier stage, and wherein a drain terminal of MOS transistor M5 provides an OUT signal for the differential amplifier stage;

a MOS transistor M6 of the first type, forming a load impedance for MOS transistor M4, wherein a drain terminal of MOS transistor M6 is connected to a drain terminal of MOS transistor M4, wherein a source terminal of MOS transistor M6 is connected to the first reference voltage, wherein a gate terminal of MOS transistor M6 is connected to the gate and drain terminals of the diode-connected transistor M9;

a MOS transistor M7 of the first type, forming a load impedance for MOS transistor M5, wherein a drain terminal of MOS transistor M7 is connected to a drain terminal of MOS transistor M5, wherein a source terminal of MOS transistor M7 is connected to the first reference voltage, wherein a gate terminal of MOS transistor M7 is connected to the gate and drain terminals of the diode-connected transistor M9.

2. The amplifier stage of claim 1 wherein the first type of MOS transistor is an NMOS type and wherein the second type of MOS transistor is a PMOS type.

3. A phase lock loop circuit, comprising:

a reference signal input terminal;

a phase/frequency detector circuit, which has a first input terminal connected to the reference signal input terminal, which has a second input terminal, and which has an output terminal for providing a control voltage;

a lowpass filter circuit connected to the output terminal of the phase/frequency detector circuit;

a voltage-to-current converter stage which has an input terminal connected to the lowpass filter circuit, and which has an output terminal providing an output current proportional to the control voltage; said voltage-to-current converter stage including:

a first MOS transistor M1 of a first type having a gate terminal connected to the lowpass filter circuit, having a source terminal connected through a resistor R1 to a first reference voltage, and having a drain terminal;

a diode-connected MOS transistor M2 of a second type having a drain terminal and a gate terminal connected together and to the drain terminal of the first MOS transistor M1, and having a source terminal connected to a second reference voltage;

a current-source MOS transistor M8 of the second type having a source terminal connected to the second reference voltage, having a gate terminal connected to the drain of the first MOS transistor M1, and having a drain terminal wherein the transistor M8 mirrors current of transistor M1;

a diode-connected transistor M9 of the first type having a gate terminal and a drain terminal connected together and to the drain terminal of transistor M8, and a source terminal connected to the first reference voltage;

two or more differential amplifier stages which are interconnected to form an oscillator circuit, each stage including:

a current-source MOS transistor M10 of the second type having a source terminal connected to the second reference voltage, having a gate terminal connected to the drain of the first MOS transistor M1, and having a drain terminal;

a pair of MOS transistors M4 and M5 of the first type having source terminals connected together and to the drain terminal of the current-source MOS transistor M10, wherein a gate terminal of MOS transistor M4 is designated as an IN terminal, wherein a gate terminal of MOS transistor M5 is designated as an IN_ terminal, wherein a drain terminal OUT_ of MOS transistor M4 provides an OUT_ signal for the differential amplifier stage, and wherein a drain terminal OUT of MOS transistor M5 provides an OUT signal for the differential amplifier stage;

a MOS transistor M6 of the first type, forming a load impedance for MOS transistor M4, wherein a drain terminal of MOS transistor M6 is connected to a drain terminal of MOS transistor M4, wherein a source terminal of MOS transistor M6 is connected to the first reference voltage, wherein a gate terminal of MOS transistor M6 is connected to the gate and drain terminals of the diode-connected transistor M9;

a MOS transistor M7 of the first type, forming a load impedance for MOS transistor M5, wherein a drain terminal of MOS transistor M7 is connected to a drain terminal of MOS transistor M5, wherein a source terminal of MOS transistor M7 is connected to the first reference voltage, wherein a gate terminal of MOS transistor M7 is connected to the gate and drain terminals of the diode-connected transistor M9;

wherein the IN terminals and the IN_ terminals of each stage are connected to OUT and OUT_ terminals of another stage to provide a VCO for the phase lock loop circuit.

4. The phase lock loop circuit of claim 3 wherein the first type of MOS transistor is an NMOS type and wherein the second type of MOS transistor is a PMOS type.

* * * * *